US012779552B2

(12) United States Patent
Johnson et al.

(10) Patent No.: US 12,779,552 B2
(45) Date of Patent: Nov. 3, 2026

(54) COATED CUTTING TOOL

(71) Applicant: AB SANDVIK COROMANT, Sandviken (SE)

(72) Inventors: Lars Johnson, Sandviken (SE); Ebba Saikoff, Sandviken (SE)

(73) Assignee: AB Sandvik Coromant, Sandviken (SE)

( * ) Notice: Subject to any disclaimer, the term of this patent is extended or adjusted under 35 U.S.C. 154(b) by 314 days.

(21) Appl. No.: 18/692,431

(22) PCT Filed: Sep. 8, 2022

(86) PCT No.: PCT/EP2022/074975
§ 371 (c)(1),
(2) Date: Mar. 15, 2024

(87) PCT Pub. No.: WO2023/041415
PCT Pub. Date: Mar. 23, 2023

(65) Prior Publication Data

US 2024/0383046 A1 Nov. 21, 2024

(30) Foreign Application Priority Data

Sep. 17, 2021 (EP) .................................... 21197469

(51) Int. Cl.
*B23B 27/16* (2006.01)
*C22C 14/00* (2006.01)
*C23C 14/18* (2006.01)
*C23C 14/32* (2006.01)

(52) U.S. Cl.
CPC .......... *B23B 27/1611* (2013.01); *C22C 14/00* (2013.01); *C23C 14/18* (2013.01); *C23C 14/325* (2013.01); *B23B 2228/10* (2013.01)

(58) Field of Classification Search
CPC ........ C23C 14/06–14/205; C23C 28/34–28/44
See application file for complete search history.

(56) References Cited

U.S. PATENT DOCUMENTS

2015/0211105 A1* 7/2015 Schier .................. C23C 28/042
428/141
2018/0193924 A1* 7/2018 Tanaka ................ C23C 14/0658

FOREIGN PATENT DOCUMENTS

EP 2098611 A2 9/2009
EP 3346026 A1 7/2018

* cited by examiner

*Primary Examiner* — Prashant J Khatri
(74) *Attorney, Agent, or Firm* — Corinne R. Gorski

(57) ABSTRACT

A coated cutting tool having a substrate and a coating is provided. The coating includes a nano-multilayer of alternating nanolayers of a first nanolayer type being $Ti_{1-x}Al_xN$, $0.35 \le x < 0.67$, a second nanolayer type being $Ti_{1-y}Si_yN$, $0.10 \le y \le 0.25$, and a third nanolayer type being $Ti_{1-z}Al_zN$, $0.70 \le z \le 0.90$. The nano-multilayer has a thickness from about 0.5 to about 10 μm. The average nanolayer thickness of each of the nanolayer types $Ti_{1-x}Al_xN$ (9), $Ti_{1-y}Si_yN$, and $Ti_{1-z}Al_zN$ in the nano-multilayer being from 1 to 30 nm.

14 Claims, 2 Drawing Sheets

COATED CUTTING TOOL

RELATED APPLICATION DATA

This application is a § 371 National Stage Application of PCT International Application No. PCT/EP2022/074975 filed Sep. 8, 2022 with priority to EP 21197469.6 filed Sep. 17, 2021.

TECHNICAL FIELD

The present invention relates to a coated cutting tool comprising a coating comprising a nano-multilayer of alternating nanolayers of $Ti_{1-x}Al_xN$, $0.35 \leq x < 0.67$, $Ti_{1-y}Si_yN$, $0.10 \leq y \leq 0.25$, and $Ti_{1-z}Al_zN$, $0.70 \leq y \leq 0.90$.

BACKGROUND

Metal machining operations include, for example, turning, milling, and drilling. In order to provide a long tool life, a coated cutting tool, such as an insert, should have high resistance against different types of wear. In order to increase wear resistance of a cutting tool various types of wear resistant coatings are known in the art.

A cutting tool generally has at least one rake face and at least one flank face. A cutting edge is present where a rake face and flank face meet.

Flank wear obviously takes place on a flank face of the cutting edge, mainly from an abrasive wear mechanism. The flank face is subjected to workpiece movement and too much flank wear will lead to poor surface texture of the workpiece, inaccuracy in the cutting process and increased friction in the cutting process.

If a better flank wear resistance is provided longer tool life is provided for certain metal machining operations.

A coating must also remain adherent to the substrate, i.e., not flake off, during a machining operation. Some workpiece material types such as ISO-M (stainless steel) and ISO-S (heat resistant super alloys and, e.g., titanium), are so called sticky materials and induce flaking more than other workpiece material types. These material types also have a smearing behaviour which means that workpiece material is smeared onto the cutting tool surface which eventually may lead to the formation of a built-up edge (BUE) of workpiece material on the cutting edge. Such a BUE may cause the coating to flake off or even rip off a part of the edge of the cutting tool.

Different metal machining operations affect a coated cutting tool in different ways. Turning, for example, is a continuous metal machining operation while milling is more intermittent in nature. In milling the thermal and mechanical load will vary over time. Thermal load induces thermal tensions which may lead to so-called thermal cracks, herein referred to as "comb cracks", in the coatings, while the later may cause fatigue in the cutting edge leading to chipping, i.e., small fragments of the cutting edge loosening from the rest of the substrate. Thus, common wear types of a coated cutting tool in milling are cracking and chipping. A high level of toughness of the coating, in particular at the cutting edge, may reduce such chipping. A high comb crack resistance and edge line toughness are thus of great importance for tool lifetime.

There is a continuing demand for coated cutting tools in which the coating has excellent properties in terms of wear resistance, edge line toughness, comb crack resistance, flaking resistance, etc. in order to provide a cutting tool with superior properties than currently available cutting tools on the market. If one or more of the above-mentioned properties are improved then longer tool life is provided.

Nano-multilayered coatings are being used in the area of cutting tools for metal machining. In these coatings at least two layers which are different in some respect alternate forming a coating of a stack of nanolayers.

OBJECT OF THE INVENTION

There is an object of the present invention to provide a coated cutting tool which, at least, shows high flank wear resistance and high flaking resistance.

SUMMARY OF THE INVENTION

The object of the invention is provided by a coated cutting tool comprising a substrate and a coating, wherein the coating comprises a from about 0.5 to about 10 μm nano-multilayer of alternating nanolayers of a first nanolayer type being $Ti_{1-x}Al_xN$, $0.35 \leq x < 0.67$, a second nanolayer type being $Ti_{1-y}Si_yN$, $0.10 \leq y \leq 0.25$, and a third nanolayer type being $Ti_{1-z}Al_zN$, $0.70 \leq z \leq 0.90$, the average nanolayer thickness of each of the nanolayer types $Ti_{1-x}Al_xN$, $Ti_{1-y}Si_yN$, and $Ti_{1-z}Al_zN$ in the nano-multilayer is from 1 to 30 nm.

By "nano-multilayer of alternating nanolayers of a first nanolayer type, a second nanolayer type, and a third nanolayer type" is herein meant that the different types of nanolayers are generally alternating in a certain order in the nano-multilayer. However, due to the way chosen for depositing the nano-multilayer in a PVD reactor, for example using a so called three-fold rotation of the tools being coated, there may be an altering of the order of the three types of nanolayers at some places within the nano-multilayer.

In one embodiment there is a ratio in the nano-multilayer between the sum of nanolayer thicknesses of all of each nanolayer types, $Ti_{1-x}Al_xN:Ti_{1-y}Si_yN:Ti_{1-z}Al_zN$, being a:b:c, wherein $0.5<a<3$, $0.5<b<3$, $0.5<c<3$, preferably $0.75<a<2.5$, $0.75<b<2.5$, $0.75<c<2.5$, most preferably $0.9<a<2.25$, $0.9<b<2.25$, $0.9<c<2.25$.

The ratio between the sum of nanolayer thicknesses of each nanolayer type, $Ti_{1-x}Al_xN:Ti_{1-y}Si_yN:Ti_{1-z}Al_zN$, in the nano-multilayer, i.e., a:b:c, can be determined by Scanning Transmission Electron Microscopy (STEM) analysis, preferably in combination with Energy-dispersive X-ray spectroscopy (EDS), where over a distance along a normal to the substrate surface the elemental composition and thicknesses of individual nanolayers are determined. A distance of at least 25 times the average nanolayer thickness is used. The sum of nanolayer thicknesses for nanolayers of the first nanolayer type $Ti_{1-x}Al_xN$ is "a", the sum of nanolayer thicknesses for nanolayers of the second nanolayer type $Ti_{1-y}Si_yN$ is "b", and the sum of nanolayer thicknesses for nanolayers of the third nanolayer type $Ti_{1-z}Al_zN$ is "c".

The average nanolayer thickness of each of the nanolayer types $Ti_{1-x}Al_xN$, $Ti_{1-y}Si_yN$, and $Ti_{1-z}Al_zN$ in the nano-multilayer can also be determined by the above described STEM/EDS analysis.

For the first nanolayer type being $Ti_{1-x}Al_xN$, suitably $0.40 \leq x \leq 0.67$, preferably $0.45 \leq x \leq 0.62$.

For the second nanolayer type being $Ti_{1-y}Si_yN$, suitably $0.13 \leq y \leq 0.23$, preferably $0.17 \leq y \leq 0.21$.

For the third nanolayer type being $Ti_{1-z}Al_2N$, suitably $0.70<z \leq 0.85$, preferably $0.75<z \leq 0.85$.

The average nanolayer thickness in the nano-multilayer of each of the nanolayer types $Ti_{1-x}Al_xN$, $Ti_{1-y}Si_yN$, and $Ti_{1-}$ ${}_{z}Al_{z}N$ in the nano-multilayer is suitably from 1 to 20 nm, preferably from 1.5 to 10 nm, most preferably from 2 to 5 nm.

The ratio of average nanolayer thickness in the nano-multilayer between any one of the nanolayer types $Ti_{1-x}Al_xN$, $Ti_{1-y}Si_yN$, and $Ti_{1-z}Al_zN$ to any of the remaining two of the nanolayer types $Ti_{1-x}Al_xN$, $Ti_{1-y}Si_yN$, and $Ti_{1-z}Al_zN$ in the nano-multilayer is suitably of from 0.1 to 10, preferably from 0.5 to 5, most preferably from 0.8 to 2.

Suitably, within a sequence of 10 consecutive nanolayers, preferably 8, most preferably 6, consecutive nanolayers, in the nano-multilayer there are all of the nanolayer types $Ti_{1-x}Al_xN$, $Ti_{1-y}Si_yN$, and $Ti_{1-z}Al_zN$ present.

The thickness of the nano-multilayer is suitably from about 1 to about 8 μm, preferably from about 1.5 to about 5 μm.

In one embodiment, the coating comprises an inner layer of TiN or (Ti,Al)N below the nano-multilayer, preferably closest to the substrate. The (Ti,Al)N layer may either be a monolayer or a nano-multilayer of alternating nanolayers of different Ti/Al ratio. Preferably, the inner layer is (Ti,Al)N. If (Ti,Al)N is used as the inner layer then the (Ti,Al)N is suitably $Ti_{1-t}Al_tN$, $0.35 \leq t \leq 0.67$, preferably $0.40 \leq t \leq 0.67$, most preferably $0.45 \leq t \leq 0.62$. In a preferred embodiment the Ti—Al relation in the (Ti,Al)N of the inner layer is the same as the Ti—Al relation in the first nanolayer type of the nano-multilayer. This is because this simplifies the production when a same target can be used as already being used for the nano-multilayer. The thickness of this inner layer is suitably from about 0.1 to about 3 μm, preferably from about 0.5 to about 2 μm.

In one embodiment, for the purpose of having control of the colour of the coated cutting tool, the coating comprises an outermost single layer of any one of the first nanolayer type $Ti_{1-x}Al_xN$, $0.35 \leq x < 0.67$, the second nanolayer type $Ti_{1-y}Si_yN$, $0.10 \leq y \leq 0.25$, or the third nanolayer type $Ti_{1-z}Al_zN$, $0.70 \leq z \leq 0.90$.

The values of x, y or z in the outermost layer is preferably the same as x, y or z in the $Ti_{1-x}Al_xN$, $Ti_{1-y}Si_yN$, or $Ti_{1-z}Al_zN$ in the nano-multilayer. This is because this simplifies the production when a same target can be used as already being used for the nano-multilayer.

The thickness of this outermost layer is suitably from about 0.1 to about 0.5 μm, preferably from about 0.1 to about 0.3 μm.

The nanolayers of the first nanolayer type, the second nanolayer type and the third nanolayer type are suitably cathodic arc evaporation deposited layers. Also the optional inner layer of TiN or (Ti,Al)N, as well as the optional outermost single layer are suitably cathodic arc evaporation deposited layers.

The substrate of the coated cutting tool can be selected from the group of cemented carbide, cermet, ceramic, cubic boron nitride and high speed steel. In one embodiment the substrate is a cemented carbide comprising from 5 to 18 wt % Co The coated cutting tool is suitably a cutting tool insert, a drill, or a solid end-mill, for metal machining. The cutting tool insert is, for example, a turning insert or a milling insert.

BRIEF DESCRIPTIONS OF THE DRAWINGS

DETAILED DESCRIPTION OF EMBODIMENTS IN DRAWINGS

Figure 1:
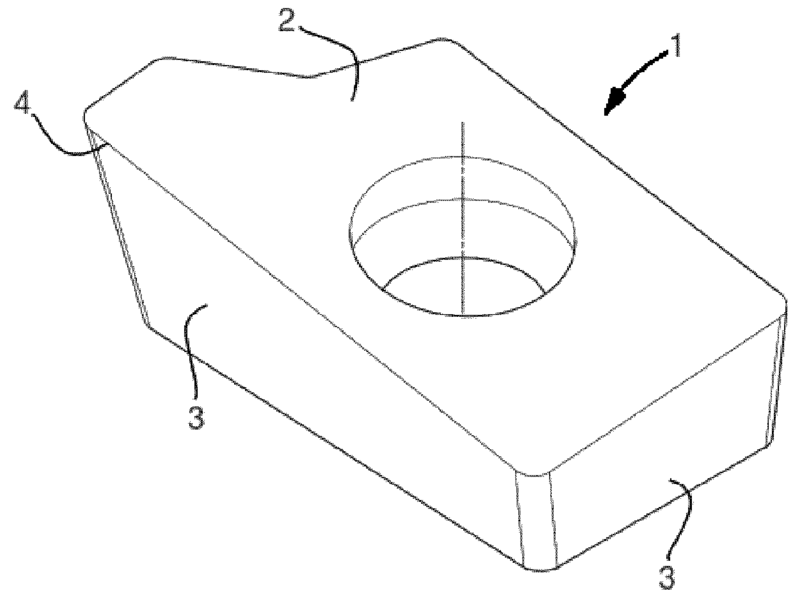
FIG. 1 shows a schematic view of one embodiment of a cutting tool being a milling insert.
Figure 2:
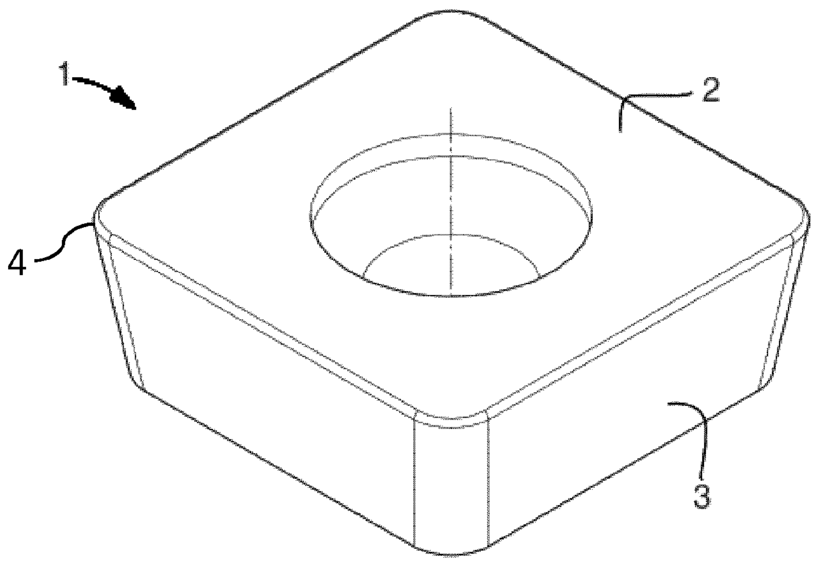
FIG. 2 shows a schematic view of one embodiment of a cutting tool being a turning insert.
Figure 3:
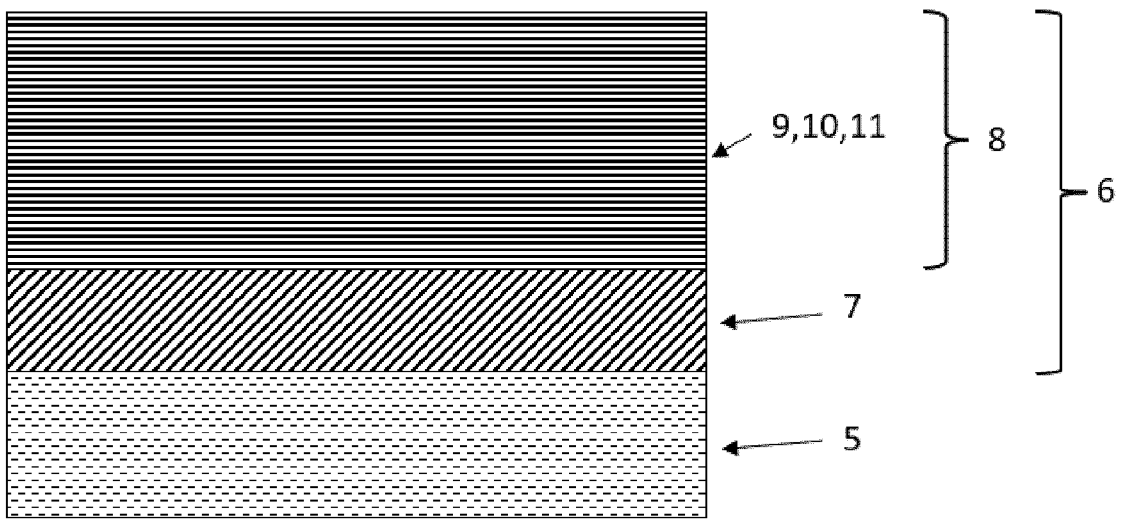
FIG. 3 shows a schematic view of a cross section of an embodiment of the coated cutting tool of the present invention showing a substrate and a coating comprising different layers.

FIG. 1 shows a schematic view of one embodiment of a cutting tool (1) having a rake face 2 and flank faces 3 and a cutting edge 4. The cutting tool 1 is in this embodiment a milling insert. FIG. 2 shows a schematic view of one embodiment of a cutting tool 1 having a rake face 2 and flank face 3 and a cutting edge 4. The cutting tool 1 is in this embodiment a turning insert. FIG. 3 shows a schematic view of a cross section of an embodiment of the coated cutting tool of the present invention having a substrate 5 and a coating 6. The coating 6 consisting of a first (Ti,Al)N innermost layer 7 followed by a nano-multilayer 8 of alternating nanolayers 9, 10 and 11 being $Ti_{1-x}Al_xN$, $Ti_{1-y}Si_yN$, and $Ti_{1-z}Al_zN$.

DETAILED DESCRIPTION OF EMBODIMENTS

In one embodiment, there is a ratio in the nano-multilayer 8 between the sum of nanolayer thicknesses of each nanolayer type 9, 10, 11, $Ti_{1-x}Al_xN:Ti_{1-y}Si_yN:Ti_{1-z}Al_zN$, in the nano-multilayer 8, a:b:c, $1.5<a<2.5$, $0.75<b<1.25$, $0.75<c<1.25$, preferably $1.75<a<2.25$, $0.9<b<1.1$, $0.9<c<1.1$. In this embodiment the nano-multilayer 8 suitably comprises a repeating sequence of consecutive nanolayers of the first nanolayer type 9, $Ti_{1-x}Al_xN$, the second nanolayer type 10, $Ti_{1-y}Si_yN$, and the third nanolayer type 11, $Ti_{1-z}Al_zN$, in the order $Ti_{1-x}Al_xN/Ti_{1-z}Al_zN/Ti_{1-x}Al_xN/Ti_{1-y}Si_yN$. The nano-multilayer 8 is suitably composed of $(Ti_{1-x}Al_xN/Ti_{1-z}Al_zN/Ti_{1-x}Al_xN/Ti_{1-y}Si_yN\ \ldots)_m$, m=15–1500, suitably m=30–800.

In a further embodiment, there is a ratio in the nano-multilayer 8 between the sum of nanolayer thicknesses of each nanolayer type 9, 10, 11, $Ti_{1-x}Al_xN:Ti_{1-y}Si_yN:Ti_{1-z}Al_zN$, in the nano-multilayer 8, a:b:c, $0.75<a<1.25$, $1.5<b<2.5$, $0.75<c<1.25$, preferably $0.9<a<1.1$, $1.75<b<2.25$, $0.9<c<1.1$. In this embodiment the nano-multilayer 8 suitably comprises a repeating sequence of consecutive nanolayers of the first nanolayer type 9, $Ti_{1-x}Al_xN$, the second nanolayer type 10, $Ti_{1-y}Si_yN$, and the third nanolayer type 11, $Ti_{1-z}Al_zN$, in the order $Ti_{1-x}Al_xN/Ti_{1-y}Si_yN/Ti_{1-z}Al_zN/Ti_{1-y}Si_yN$. The nano-multilayer (8) is suitably composed of $(Ti_{1-x}Al_xN/Ti_{1-y}Si_yN/Ti_{1-z}Al_zN/Ti_{1-y}Si_yN)_n$, n=15–1500, suitably n=30–800.

In a further embodiment, there is a ratio in the nano-multilayer 8 between the sum of nanolayer thicknesses of each nanolayer type 9, 10, 11, $Ti_{1-x}Al_xN:Ti_{1-y}Si_yN:Ti_{1-z}Al_zN$, in the nano-multilayer 8, a:b:c, $0.75<a<1.25$, $0.75<b<1.25$, $1.5<c<2.5$, preferably $0.9<a<1.1$, $0.9<b<1.1$, $1.75<c<2.25$. In this embodiment the nano-multilayer 8 suitably comprises a repeating sequence of consecutive nanolayers of the first nanolayer type 9, $Ti_{1-x}Al_xN$, the second nanolayer type 10, $Ti_{1-y}Si_yN$, and the third nanolayer type 11, $Ti_{1-z}Al_zN$, in the order $Ti_{1-z}Al_zN/Ti_{1-x}Al_xN/Ti_{1-z}Al_zN/Ti_{1-y}Si_yN$. The nano-multilayer 8 is suitably composed of $(Ti_{1-z}Al_zN/Ti_{1-x}Al_xN/Ti_{1-z}Al_zN/Ti_{1-y}Si_yN)_p$, p=15–1500, suitably p=30–800.

In a further embodiment, there is a ratio in the nano-multilayer 8 between the sum of nanolayer thicknesses of each nanolayer type 9, 10, 11, $Ti_{1-x}Al_xN:Ti_{1-y}Si_yN:Ti_{1-z}Al_zN$, in the nano-multilayer 8, a:b:c, $0.75<a<1.25$, 0.75<b<1.25, 0.75<c<1.25, preferably 0.9<a<1.1, 0.9<b<1.1, 0.9<c<1.1. In this embodiment the nano-multilayer 8 suitably comprises a repeating sequence of consecutive nanolayers of the first nanolayer type 9, $Ti_{1-x}Al_xN$, the second nanolayer type 10, $Ti_{1-y}Si_yN$, and the third nanolayer type 11, $Ti_{1-z}Al_zN$, in the order $Ti_{1-x}Al_xN/Ti_{1-y}Si_yN/Ti_{1-z}Al_zN$. The nano-multilayer 8 is suitably composed of $(Ti_{1-x}Al_xN/Ti_{1-y}Si_yN/Ti_{1-z}Al_zN)_q$, q=20-2000, suitably q=40-1000.

In a further embodiment, the coating 6 comprises an inner layer 7, preferably closest to the substrate 5, of (Ti,Al)N below the nano-multilayer 8 wherein the inner layer 7 is a (Ti,Al)N layer being a (Ti,Al)N nano-multilayer of alternating nanolayers of $Ti_{1-u}Al_uN$, 0.35≤u<0.67, suitably 0.40≤u≤0.67, preferably 0.45≤u≤0.62 and $Ti_{1-v}Al_vN$, 0.70≤v≤0.90, suitably 0.70≤v≤0.80.

The average nanolayer thickness of the $Ti_{1-u}Al_uN$ layers in the (Ti,Al)N nano-multilayer is suitably from 1 to 30 nm, preferably from 1 to 20 nm, most preferably from 2 to 10 nm. The thickness of this inner layer 7 is suitably from about 0.1 to about 3 μm, preferably from about 0.5 to about 2 μm.

EXAMPLES

Example 1 (Invention)

Coated cutting tools were provided comprising a nano-multilayer of $Ti_{0.85}Si_{0.15}N$, $Ti_{0.50}Al_{0.50}N$ and $Ti_{0.20}Al_{0.80}N$ nanolayers deposited on sintered cemented carbide cutting tool insert blanks of the geometries CNMG120408MM and R390-11T308M-PM. The composition of the cemented carbide was 10 wt % Co, 0.4 wt % Cr and rest WC. The cemented carbide blanks were coated by cathodic arc evaporation in a vacuum chamber comprising four arc flanges, each flange comprising several cathode evaporators. Targets of $Ti_{0.50}Al_{0.50}$ were mounted in the evaporators in two of the flanges opposite each other. The remaining targets $Ti_{0.85}Si_{0.15}$ and $Ti_{0.20}Al_{0.80}$ were mounted in the evaporators in the two remaining flanges opposite each other. The targets were circular and planar with a diameter of 100 mm available on the open market. Suitable target technology packages for arc evaporation are available from suppliers on the market such as IHI Hauzer Techno Coating B.V., Kobelco (Kobe Steel Ltd.) and Oerlikon Balzers.

The uncoated blanks were mounted on pins that undergo a three-fold rotation in the PVD chamber.

The chamber was pumped down to high vacuum (less than $10^{-2}$ Pa) and heated to about 450-550° C. by heaters located inside the chamber. The blanks were then etched for 60 minutes in an Ar plasma.

At first, an innermost layer of $Ti_{0.50}Al_{0.50}N$ was deposited by only using the $Ti_{0.50}Al_{0.50}$ targets.

The chamber pressure (reaction pressure) was set to 4 Pa of $N_2$ gas, and a DC bias voltage of −50 V (relative to the chamber walls) was applied to the blank assembly. The cathodes were run in an arc discharge mode at a current of 150 A (each) for 70 minutes (2 flanges). The table rotational speed was 5 rpm. A layer of $Ti_{0.50}Al_{0.50}N$ having a thickness of about 1.4 μm was deposited on the blanks.

Then, the nano-multilayer was deposited by using all mounted targets.

The chamber pressure (reaction pressure) was set to 4 Pa of $N_2$ gas, and a DC bias voltage of −70 V (relative to the chamber walls) was applied to the blank assembly. The cathodes were run in an arc discharge mode at a current of 150 A (each) for 35 minutes (4 flanges). The table rotational speed was 5 rpm. A nano-multilayer coating having a thickness of about 1.4 μm was deposited on the blanks.

The rotational speed correlates to a certain period thickness and it was concluded that a table rotational speed of 5 rpm for the current deposition rate and equipment used correlates to an average individual nanolayer thickness of each of the nanolayers $Ti_{0.50}Al_{0.50}N$, $Ti_{0.85}Si_{0.15}N$ and $Ti_{0.20}Al_{0.80}N$ of about 2 nm. The number of nanolayers in the nano-multilayer is about 700.

The nano-multilayer comprises a repeating sequence of consecutive nanolayers in the order $Ti_{0.50}Al_{0.50}N/Ti_{0.20}Al_{0.80}N/Ti_{0.50}Al_{0.50}N/Ti_{0.85}Si_{0.15}N$.

Finally, an outermost layer of $Ti_{0.85}Si_{0.15}N$, in order to obtain an even colour between the individual coated cutting tools made, was deposited by only using the $Ti_{0.85}Si_{0.15}$ target. All deposition parameters were the same as for depositing the previous layer, except for the bias being −60 V and the cathodes were run for 10 minutes (1 flange). A layer of $Ti_{0.85}Si_{0.15}N$ was deposited to a thickness of about 0.2 μm.

In the nano-multilayer, the ratio of the sum of nanolayer thicknesses of each of the nanolayers $Ti_{0.50}Al_{0.50}N$, $Ti_{0.85}Si_{0.15}N$, $Ti_{0.20}Al_{0.80}N$, respectively, i.e., $Ti_{0.50}Al_{0.50}N$: $Ti_{0.85}Si_{0.15}N$: $Ti_{0.20}Al_{0.80}N$, is about 2:1:1. The ratio is estimated from a deposition rate from each target assumed to be the same, the rotation during deposition and the deposition time.

The coated cutting tools were called "Sample 1 (invention)".

Example 2

Coated cutting tools were provided comprising a nano-multilayer of $Ti_{0.85}Si_{0.15}N$, $Ti_{0.50}Al_{0.50}N$ and $Ti_{0.20}Al_{0.80}N$ nanolayers deposited on sintered cemented carbide cutting tool insert blanks of the geometries CNMG120408MM and R390-11T308M-PM. The composition of the cemented carbide was 10 wt % Co, 0.4 wt % Cr and rest WC. The cemented carbide blanks were coated by cathodic arc evaporation in a vacuum chamber comprising four arc flanges, each flange comprising several cathode evaporators. Targets of $Ti_{0.50}Al_{0.50}$ were mounted in the evaporators in two of the flanges opposite each other. The remaining targets $Ti_{0.85}Si_{0.15}$ and $Ti_{0.20}Al_{0.80}$ were mounted in the evaporators in the two remaining flanges opposite each other. The targets were circular and planar with a diameter of 100 mm available on the open market. Suitable target technology packages for arc evaporation are available from suppliers on the market such as IHI Hauzer Techno Coating B.V., Kobelco (Kobe Steel Ltd.) and Oerlikon Balzers.

The uncoated blanks were mounted on pins that undergo a three-fold rotation in the PVD chamber.

The chamber was pumped down to high vacuum (less than $10^{-2}$ Pa) and heated to about 450-550° C. by heaters located inside the chamber. The blanks were then etched for 60 minutes in an Ar plasma.

At first, an innermost layer of $Ti_{0.50}Al_{0.50}N$ was deposited by only using the $Ti_{0.50}Al_{0.50}$ targets.

The chamber pressure (reaction pressure) was set to 4 Pa of $N_2$ gas, and a DC bias voltage of −50 V (relative to the chamber walls) was applied to the blank assembly. The cathodes were run in an arc discharge mode at a current of 150 A (each) for 70 minutes (2 flanges). The table rotational speed was 5 rpm. A layer of $Ti_{0.50}Al_{0.50}N$ having a thickness of about 1.4 μm was deposited on the blanks.

Then, the nano-multilayer was deposited by alternating the use of the $Ti_{0.85}Si_{0.15}$ and $Ti_{0.20}Al_{0.80}$ targets, creating a first sequence of a $Ti_{0.85}Si_{0.15}N/Ti_{0.20}Al_{0.80}N$ nano-multilayer of about 35 nm thickness. The table rotational speed was 5 rpm. Then only the $Ti_{0.50}Al_{0.50}$ targets were used creating a $Ti_{0.50}Al_{0.50}N$ layer of about 35 nm thickness. This procedure was repeated until 20 sequences of a nano-multilayer sequence of nanolayers $Ti_{0.85}Si_{0.15}N$ and $Ti_{0.20}Al_{0.80}N$ combined with a "monolayer" of $Ti_{0.50}Al_{0.50}N$ was completed. The total thickness of the deposited nano-multilayer was about 1.4 μm.

The chamber pressure (reaction pressure) was set to 4 Pa of $N_2$ gas, and a DC bias voltage of −40 V (relative to the chamber walls) was applied to the blank assembly when using the $Ti_{0.85}Si_{0.15}$ and $Ti_{0.20}Al_{0.80}$ targets and a DC bias voltage of −80 V (relative to the chamber walls) when using the $Ti_{0.50}Al_{0.50}$ targets. The cathodes were run in an arc discharge mode at a current of 150 A (each) for 70 minutes (2 flanges at a time). The table rotational speed was 5 rpm. A nano-multilayer coating having a thickness of about 1.4 μm was deposited on the blanks.

The rotational speed correlates to a certain period thickness and it was concluded that a table rotational speed of 5 rpm for the current deposition rate and equipment used correlates to an average individual nanolayer thickness of each of the nanolayers $Ti_{0.85}Si_{0.15}N$ and $Ti_{0.20}Al_{0.80}N$ of about 2 nm.

Finally, an outermost layer of $Ti_{0.85}Si_{0.15}N$, in order to obtain an even colour between the individual coated cutting tools made, was deposited by only using the $Ti_{0.85}Si_{0.15}$ target. All deposition parameters were the same as for depositing the previous layer, except for the bias being −60 V and the cathodes were run for 10 minutes (1 flange). A layer of $Ti_{0.85}Si_{0.15}N$ was deposited to a thickness of about 0.2 μm.

The coated cutting tools were called "Sample 2 (comparative)".

Example 3

Three different sets of samples of coated cutting tools were provided comprising a nano-multilayer of $Ti_{0.80}Si_{0.20}N$, $Ti_{0.40}Al_{0.60}N$ nanolayers and, respectively, one of a high-Al $Ti_{0.25}Al_{0.75}N$, $Ti_{0.15}Al_{0.85}N$ or $Ti_{0.05}Al_{0.95}N$ nanolayers deposited on sintered cemented carbide cutting tool insert blanks of the geometries CNMG120408MM and R390-11T308M-PM. The composition of the cemented carbide was 10 wt % Co, 0.4 wt % Cr and rest WC. The cemented carbide blanks were coated by cathodic arc evaporation in a vacuum chamber comprising four arc flanges, each flange comprising several cathode evaporators. Targets of $Ti_{0.80}Si_{0.20}$ were mounted in the evaporators in two of the flanges opposite each other. The remaining targets $Ti_{0.40}Al_{0.60}$ and the high-Al (Ti,Al) target used ($Ti_{0.25}Al_{0.75}$, $Ti_{0.15}Al_{0.85}$ or $Ti_{0.05}Al_{0.95}$, respectively, in the three differents runs) were mounted in the evaporators in the two remaining flanges opposite each other. The targets were circular and planar with a diameter of 100 mm available on the open market. Suitable target technology packages for arc evaporation are available from suppliers on the market such as IHI Hauzer Techno Coating B.V., Kobelco (Kobe Steel Ltd.) and Oerlikon Balzers.

The uncoated blanks were mounted on pins that undergo a three-fold rotation in the PVD chamber.

The chamber was pumped down to high vacuum (less than $10^{-2}$ Pa) and heated to about 450-550° C. by heaters located inside the chamber. The blanks were then etched for 60 minutes in an Ar plasma.

At first, an innermost layer of $Ti_{0.40}Al_{0.60}N$ was deposited by only using the $Ti_{0.40}Al_{0.60}$ target. The chamber pressure (reaction pressure) was set to 4 Pa of $N_2$ gas, and a DC bias voltage of −70 V (relative to the chamber walls) was applied to the blank assembly. The cathodes were run in an arc discharge mode at a current of 150 A (each) for 100 minutes (1 flange). The table rotational speed was 5 rpm. A layer of $Ti_{0.40}Al_{0.60}N$ having a thickness of about 1 μm was deposited on the blanks.

Then, the nano-multilayer was deposited by using all mounted targets.

The chamber pressure (reaction pressure) was set to 4 Pa of $N_2$ gas, and a DC bias voltage of −100 V (relative to the chamber walls) was applied to the blank assembly. The cathodes were run in an arc discharge mode at a current of 150 A (each) for 50 minutes (4 flanges). The table rotational speed was 5 rpm. A nano-multilayer coating having a thickness of about 2 μm was deposited on the blanks.

Since the table rotational speed correlates to a certain period thickness and it was concluded that a table rotational speed of 5 rpm for the current deposition rate and equipment used correlates to an average individual nanolayer thickness of each of the nanolayers $Ti_{0.40}Al_{0.60}N$, $Ti_{0.80}Si_{0.20}N$ and also $Ti_{0.25}Al_{0.75}N$, $Ti_{0.15}Al_{0.85}N$ and $Ti_{0.05}Al_{0.95}N$, respectively, in the three different nano-multilayers made of about 2 nm. The number of nanolayers in all three different sets of nano-multilayers is about 1000.

The nano-multilayer of the first set of samples comprises a repeating sequence of consecutive nanolayers in the order $Ti_{0.40}Al_{0.60}N/Ti_{0.80}Si_{0.20}N/Ti_{0.25}Al_{0.75}N/Ti_{0.80}Si_{0.20}N$. The nano-multilayer of the second set of samples comprises a repeating sequence of consecutive nanolayers in the order $Ti_{0.40}Al_{0.60}N/Ti_{0.80}Si_{0.20}N/Ti_{0.15}Al_{0.85}N/Ti_{0.80}Si_{0.20}N$. The nano-multilayer of the third set of samples comprises a repeating sequence of consecutive nanolayers in the order $Ti_{0.40}Al_{0.60}N/Ti_{0.80}Si_{0.20}N/Ti_{0.05}Al_{0.95}N/Ti_{0.80}Si_{0.20}N$.

Finally, an outermost layer, in order to obtain an even colour between the individual coated cutting tools made, was deposited by only using the respective high-Al (Ti,Al) target used when depositing the respective nano-multilayer for the three different sets of samples. All deposition parameters were the same as for depositing the previous layer, except for the bias being −100 V and the cathodes were run for 10 minutes (1 flange). A layer of $Ti_{0.25}Al_{0.75}N$, $Ti_{0.15}Al_{0.85}N$ or $Ti_{0.05}Al_{0.95}N$ was deposited, respectively, on the three different sets of samples, to a thickness of about 0.2 μm.

In the nano-multilayer, the thickness ratio sum of thicknesses of each of the nanolayers $Ti_{0.40}Al_{0.60}N$, $Ti_{0.85}Si_{0.15}N$, and the one of $Ti_{0.25}Al_{0.75}N$, $Ti_{0.15}Al_{0.85}N$, and $Ti_{0.05}Al_{0.95}N$, respectively, i.e., $Ti_{0.40}Al_{0.60}N$: $Ti_{0.85}Si_{0.15}N$: ($Ti_{0.25}Al_{0.75}N$, $Ti_{0.15}Al_{0.85}N$, or $Ti_{0.05}Al_{0.95}N$), is about 1:2:1. The ratio is estimated from a deposition rate from each target assumed to be the same, the rotation during deposition and the deposition time.

The coated cutting tools made were called:

"Sample 3" for the coated cutting tools where the nano-multilayer is composed of nanolayers of $Ti_{0.80}Si_{0.20}N$, $Ti_{0.40}Al_{0.60}N$ and $Ti_{0.25}Al_{0.75}N$, "Sample 4" for the coated cutting tools where the nano-multilayer is composed of nanolayers of $Ti_{0.80}Si_{0.20}N$, $Ti_{0.40}Al_{0.60}N$ and $Ti_{0.15}Al_{0.85}N$, "Sample 5" for the coated cutting tools where the nano-multilayer is composed of nanolayers of $Ti_{0.80}Si_{0.20}N$, $Ti_{0.40}Al_{0.60}N$ and $Ti_{0.05}Al_{0.95}N$.

Example 4

Coated cutting tools were provided comprising a nano-multilayer of $Ti_{0.80}Si_{0.20}N$, $Ti_{0.40}Al_{0.60}N$ and $Ti_{0.25}Al_{0.75}N$ nanolayers deposited on sintered cemented carbide cutting tool insert blanks of the geometries CNMG120408MM and R390-11T308M-PM. The composition of the cemented carbide was 10 wt % Co, 0.4 wt % Cr and rest WC. The cemented carbide blanks were coated by cathodic arc evaporation in a vacuum chamber comprising four arc flanges, each flange comprising several cathode evaporators. Targets of $Ti_{0.80}Si_{0.20}$ were mounted in the evaporators in two of the flanges opposite each other. The remaining targets $Ti_{0.40}Al_{0.60}$ and $Ti_{0.25}Al_{0.75}$ were mounted in the evaporators in the two remaining flanges opposite each other. The targets were circular and planar with a diameter of 100 mm available on the open market. Suitable target technology packages for arc evaporation are available from suppliers on the market such as IHI Hauzer Techno Coating B.V., Kobelco (Kobe Steel Ltd.) and Oerlikon Balzers.

The uncoated blanks were mounted on pins that undergo a three-fold rotation in the PVD chamber.

The chamber was pumped down to high vacuum (less than $10^{-2}$ Pa) and heated to about 450-550° C. by heaters located inside the chamber. The blanks were then etched for 60 minutes in an Ar plasma.

At first, an innermost layer being a nano-multilayer of $Ti_{0.40}Al_{0.60}N$ and $Ti_{0.25}Al_{0.75}N$ nanolayers was deposited by only using the $Ti_{0.40}Al_{0.60}$ and $Ti_{0.25}Al_{0.75}$ targets.

The chamber pressure (reaction pressure) was set to 4 Pa of $N_2$ gas, and a DC bias voltage of −100 V (relative to the chamber walls) was applied to the blank assembly. The cathodes were run in an arc discharge mode at a current of 150 A (each) for 50 minutes (2 flanges). The table rotational speed was 5 rpm. A layer of a nano-multilayer of $Ti_{0.40}Al_{0.60}N$ and $Ti_{0.25}Al_{0.75}N$ having a thickness of about 1 μm was deposited on the blanks. Since the rotational speed for the current deposition rate and equipment used correlates to a certain period thickness it was concluded that the average individual nanolayer thickness was about 2 nm.

Then, the nano-multilayer of $Ti_{0.80}Si_{0.20}N$, $Ti_{0.40}Al_{0.60}N$ and $Ti_{0.25}Al_{0.75}N$ nanolayers was deposited by using all mounted targets.

The chamber pressure (reaction pressure) was set to 4 Pa of $N_2$ gas, and a DC bias voltage of −100 V (relative to the chamber walls) was applied to the blank assembly. The cathodes were run in an arc discharge mode at a current of 150 A (each) for 50 minutes (4 flanges). The table rotational speed was 5 rpm. A nano-multilayer coating having a thickness of about 2 μm was deposited on the blanks.

The rotational speed correlates to a certain period thickness and it was concluded that a table rotational speed of 5 rpm for the current deposition rate and equipment used correlates to an average individual nanolayer thickness of each of the nanolayers $Ti_{0.40}Al_{0.60}N$, $Ti_{0.80}Si_{0.20}N$ and $Ti_{0.25}Al_{0.75}N$ of about 2 nm. The number of nanolayers in the nano-multilayer is about 1000.

The nano-multilayer comprises a repeating sequence of consecutive nanolayers in the order $Ti_{0.40}Al_{0.60}N$/$Ti_{0.80}Si_{0.20}N$/$Ti_{0.25}Al_{0.75}N$/$Ti_{0.80}Si_{0.20}N$.

Finally, an outermost layer of $Ti_{0.25}Al_{0.75}N$, in order to obtain an even colour between the individual coated cutting tools made, was deposited by only using the $Ti_{0.25}Al_{0.75}$ target. All deposition parameters were the same as for depositing the previous layer, and the cathodes were run for 10 minutes (1 flange). A layer of $Ti_{0.25}Al_{0.75}N$ was deposited to a thickness of about 0.2 μm.

In the nano-multilayer of three nanolayer types, the thickness ratio sum of thicknesses of each of the nanolayers $Ti_{0.40}Al_{0.60}N$, $Ti_{0.80}Si_{0.20}N$, $Ti_{0.25}Al_{0.75}N$, respectively, i.e., $Ti_{0.40}Al_{0.60}N$: $Ti_{0.80}Si_{0.20}N$: $Ti_{0.25}Al_{0.75}N$, is about 1:2:1. The ratio is estimated from a deposition rate from each target assumed to be the same, the rotation during deposition and the deposition time.

The coated cutting tools were called "Sample 6".

Example 5

Coated cutting tools were provided comprising a nano-multilayer of $Ti_{0.80}Si_{0.20}N$, $Ti_{0.40}Al_{0.60}N$ and $Ti_{0.15}Al_{0.85}N$ nanolayers deposited on sintered cemented carbide cutting tool insert blanks of the geometries CNMG120408MM and R390-11T308M-PM. The composition of the cemented carbide was 10 wt % Co, 0.4 wt % Cr and rest WC. The cemented carbide blanks were coated by cathodic arc evaporation in a vacuum chamber comprising four arc flanges, each flange comprising several cathode evaporators. Two targets of $Ti_{0.15}Al_{0.85}$ were mounted in the evaporators in two of the flanges opposite each other. The remaining targets $Ti_{0.40}Al_{0.60}$ and $Ti_{0.80}Si_{0.20}$ were mounted in the evaporators in the two remaining flanges opposite each other. The targets were circular and planar with a diameter of 100 mm available on the open market. Suitable target technology packages for arc evaporation are available from suppliers on the market such as IHI Hauzer Techno Coating B.V., Kobelco (Kobe Steel Ltd.) and Oerlikon Balzers.

The uncoated blanks were mounted on pins that undergo a three-fold rotation in the PVD chamber.

The chamber was pumped down to high vacuum (less than $10^{-2}$ Pa) and heated to about 450-550° C. by heaters located inside the chamber. The blanks were then etched for 60 minutes in an Ar plasma.

At first, an innermost layer of $Ti_{0.40}Al_{0.60}N$ was deposited by only using the $Ti_{0.40}Al_{0.60}$ target.

The chamber pressure (reaction pressure) was set to 4 Pa of $N_2$ gas, and a DC bias voltage of −70 V (relative to the chamber walls) was applied to the blank assembly. The cathodes were run in an arc discharge mode at a current of 150 A (each) for 100 minutes (1 flange). The table rotational speed was 5 rpm. A layer of $Ti_{0.40}Al_{0.60}N$ having a thickness of about 1 μm was deposited on the blanks.

Then, the nano-multilayer was deposited by using all mounted targets.

The chamber pressure (reaction pressure) was set to 4 Pa of $N_2$ gas, and a DC bias voltage of −100 V (relative to the chamber walls) was applied to the blank assembly. The cathodes were run in an arc discharge mode at a current of 150 A (each) for 50 minutes (4 flanges). The table rotational speed was 5 rpm. A nano-multilayer coating having a thickness of about 2 μm was deposited on the blanks.

The rotational speed correlates to a certain period thickness and it was concluded that a table rotational speed of 5 rpm for the current deposition rate and equipment used correlates to an average individual nanolayer thickness of each of the nanolayers $Ti_{0.40}Al_{0.60}N$, $Ti_{0.80}Si_{0.20}N$ and $Ti_{0.15}Al_{0.85}N$ of about 2 nm. The number of nanolayers in the nano-multilayer is about 1000.

The nano-multilayer comprises a repeating sequence of consecutive nanolayers in the order $Ti_{0.15}Al_{0.85}N$/$Ti_{0.40}Al_{0.60}N$/$Ti_{0.15}Al_{0.85}N$/$Ti_{0.80}Si_{0.20}N$.

Finally, an outermost layer of $Ti_{0.15}Al_{0.85}N$, in order to obtain an even colour between the individual coated cutting tools made, was deposited by only using the $Ti_{0.15}Al_{0.85}$ target. All deposition parameters were the same as for depositing the previous layer and the cathodes were run for 10 minutes (1 flange). A layer of $Ti_{0.15}Al_{0.85}N$ was deposited to a thickness of about 0.2 μm.

The coated cutting tools were called "Sample 7".

In the nano-multilayer, the thickness ratio sum of thicknesses of each of the nanolayers $Ti_{0.40}Al_{0.60}N$, $Ti_{0.80}Si_{0.20}N$, $Ti_{0.15}Al_{0.85}N$, respectively, i.e., $Ti_{0.40}Al_{0.60}N$: $Ti_{0.80}Si_{0.20}N$: $Ti_{0.15}Al_{0.85}N$, is about 1:1:2. The ratio is estimated from a deposition rate from each target assumed to be the same, the rotation during deposition and the deposition time.

The samples 1-7 made are listed in Table 1.

TABLE 1

| Sample | Inner layer | Nano-multilayer: First nanolayer type | Nano-multilayer: Second nanolayer type | Nano-multilayer: Third nanolayer type | Outermost layer |
|---|---|---|---|---|---|
| 1 invention | $Ti_{0.50}Al_{0.50}N$, 1.4 μm | $Ti_{0.50}Al_{0.50}N$ | $Ti_{0.85}Si_{0.15}N$ 1.4 μm | $Ti_{0.20}Al_{0.80}N$ | $Ti_{0.85}Si_{0.15}N$ 0.2 μm |
| 2 comparative | $Ti_{0.50}Al_{0.50}N$, 1.4 μm | $Ti_{0.50}Al_{0.50}N$* | $Ti_{0.85}Si_{0.15}N$** 1.4 μm | $Ti_{0.20}Al_{0.80}N$** | $Ti_{0.85}Si_{0.15}N$ 0.2 μm |
| 3 invention | $Ti_{0.40}Al_{0.60}N$, 1 μm | $Ti_{0.40}Al_{0.60}N$ | $Ti_{0.80}Si_{0.20}N$ 2 μm | $Ti_{0.25}Al_{0.75}N$ | $Ti_{0.25}Al_{0.75}N$ 0.2 μm |
| 4 invention | $Ti_{0.40}Al_{0.60}N$, 1 μm | $Ti_{0.40}Al_{0.60}N$ | $Ti_{0.80}Si_{0.20}N$ 2 μm | $Ti_{0.15}Al_{0.85}N$ | $Ti_{0.15}Al_{0.85}N$ 0.2 μm |
| 5 comparative | $Ti_{0.40}Al_{0.60}N$, 1 μm | $Ti_{0.40}Al_{0.60}N$ | $Ti_{0.80}Si_{0.20}N$ 2 μm | $Ti_{0.05}Al_{0.95}N$ | $Ti_{0.05}Al_{0.95}N$ 0.2 μm |
| 6 invention | nano-multi $Ti_{0.40}Al_{0.60}N$/ $Ti_{0.25}Al_{0.75}N$ 1 μm | $Ti_{0.40}Al_{0.60}N$ | $Ti_{0.80}Si_{0.20}N$ 2 μm | $Ti_{0.25}Al_{0.75}N$ | $Ti_{0.25}Al_{0.75}N$ 0.2 μm |
| 7 invention | $Ti_{0.40}Al_{0.60}N$, 1 μm | $Ti_{0.40}Al_{0.60}N$ | $Ti_{0.80}Si_{0.20}N$ 2 μm | $Ti_{0.15}Al_{0.85}N$ | $Ti_{0.15}Al_{0.85}N$ 0.2 μm |

*about 35 nm $Ti_{0.50}Al_{0.50}N$
**about 35 nm nano-multilayer of $Ti_{0.85}Si_{0.15}N$/$Ti_{0.20}Al_{0.80}N$ Table 2 further summarises the samples 1-7.

TABLE 2

| Sample | Inner layer | Nanolayer sequence in nano-multilayer | Thickness ratio sum of nanolayer thicknesses of each nanolayer type $Ti_{1-x}Al_xN$:$Ti_{1-y}Si_yN$:$Ti_{1-z}Al_zN$ |
|---|---|---|---|
| 1 invention | $Ti_{0.50}Al_{0.50}N$, 1.4 μm | $(Ti_{0.50}Al_{0.50}N/Ti_{0.20}Al_{0.80}N/Ti_{0.50}Al_{0.50}N/Ti_{0.85}Si_{0.15}N)_{175}$ | 2:1:1 |
| 2 comparative | $Ti_{0.50}Al_{0.50}N$, 1.4 μm | (35 nm $Ti_{0.50}Al_{0.50}N$ + 35 nm $(Ti_{0.85}Si_{0.15}N/Ti_{0.20}Al_{0.80}N)_9)_{20}$ | 2:1:1 |
| 3 invention | $Ti_{0.40}Al_{0.60}N$, 1 μm | $(Ti_{0.40}Al_{0.60}N/Ti_{0.80}Si_{0.20}N/Ti_{0.25}Al_{0.75}N/Ti_{0.80}Si_{0.20}N)_{250}$ | 1:2:1 |
| 4 invention | $Ti_{0.40}Al_{0.60}N$, 1 μm | $(Ti_{0.40}Al_{0.60}N/Ti_{0.80}Si_{0.20}N/Ti_{0.15}Al_{0.85}N/Ti_{0.80}Si_{0.20}N)_{250}$ | 1:2:1 |
| 5 comparative | $Ti_{0.40}Al_{0.60}N$, 1 μm | $(Ti_{0.40}Al_{0.60}N/Ti_{0.80}Si_{0.20}N/Ti_{0.05}Al_{0.95}N/Ti_{0.80}Si_{0.20}N)_{250}$ | 1:2:1 |
| 6 invention | nano-multi $Ti_{0.40}Al_{0.60}N$/ $Ti_{0.25}Al_{0.75}N$ 1 μm | $(Ti_{0.40}Al_{0.60}N/Ti_{0.80}Si_{0.20}N/Ti_{0.25}Al_{0.75}N/Ti_{0.80}Si_{0.20}N)_{250}$ | 1:2:1 |
| 7 invention | $Ti_{0.40}Al_{0.60}N$, 1 μm | $(Ti_{0.15}Al_{0.85}N/Ti_{0.40}Al_{0.60}N/Ti_{0.15}Al_{0.85}N/Ti_{0.80}Si_{0.20}N)_{250}$ | 1:1:2 |

Example 6

Cutting tests were made in order to determine the performance of the samples made.

Explanations to Terms Used:

The following expressions/terms are commonly used in metal cutting, but nevertheless explained in the table below:

- Vc (m/min): cutting speed in meters per minute
- fz (mm/tooth): feed rate in millimeter per tooth (in milling)
- fn (mm/rev) feed rate per revolution (in turning)
- z: (number) number of teeth in the cutter
- $a_e$ (mm): radial depth of cut in millimeter
- $a_p$ (mm): axial depth of cut in millimeter Flank Wear Test:

- Longitudinal turning
- Work piece material: Sverker 21 (tool steel), Hardness~210 HB, D=180, L=700 mm, $V_c$=125 m/min
- $f_n$=0.072 mm/rev
- $a_p$=2 mm
- without cutting fluid The cut-off criteria for tool life is a flank wear VB of 0.15 mm.

Flaking Resistance:

The evaluation was made through turning test in austenitic stainless steel. In order to provoke adhesive wear and flaking of the coating the depth of cut $a_p$ was varied between 4 to 0 and 0 to 4 mm (in one run during radial facing). The inserts were evaluated through SEM analysis.

Operation: Facing (turning)

Work piece material: Bar of austenitic stainless steel Sanmac 316L, L=200 mm, D=100 mm, ~215 HB Insert type: CNMG 120408MM Cooling: yes Depth of cut $a_p$=4 to 0, 0 to 4 mm Cutting speed $V_c$=140 m/min Feed rate $f_z$=0.36 mm/rev

TABLE 3

| Sample | Flank wear resistance (Tool life, min) | Flaking resistance 140 m/min (Flaked area mm$^2$) |
|---|---|---|
| 1 invention | 13 | 0.04 |
| 2 comparative | 7 | 0.26 |
| 3 invention | 18 | 0.12 |
| 4 invention | 12 | 0.14 |
| 5 comparative | 6 | 0.15 |
| 6 invention | 14 | 0.16 |
| 7 invention | 13 | 0.17 |

It is concluded that samples 1, 3, 4, 6 and 7, within the invention, have high flank wear resistance and show much less flank wear than comparative samples 2 and 5 outside the invention.

It is concluded that samples 1, 3, 4, 6 and 7, within the invention, have high flaking resistance and perform much better that comparative sample 2 outside the invention.

Effect of Alternative Inner Layer:

Sample 3 and sample 6 differ in that sample 6 has an inner (Ti,Al)N nano-multilayer instead of a single (Ti,Al)N layer. Further cutting tests were made on Sample 3 and Sample 6 in order to determine the effect on comb crack resistance and edge line toughness by having the alternative inner layer in Sample 6.

Comb Crack Resistance:

Operation: Shoulder milling

Tool holder: C5-391.20-25 080

Work piece material: Toolox 33 (tool steel), L=600 mm, I=200 mm, h=100 mm,

Insert type: R390-11T308M-PM

Cutting speed $V_c$=250 m/min

Feed rate $f_z$=0.2 mm/rev

Depth of cut $a_p$=3 mm

Radial engagement $a_e$=12.5 mm with cutting fluid

The criteria for end of tool life is a max. chipped height VB>0.3 mm.

Edge Line Toughness:

Work piece material: Dievar unhardened, P3. 0.Z.AN, z=1

$V_c$=200 m/min $f_z$=0.20 mm $a_e$=12 mm $a_p$=3.0 length of cut=12 mm without cutting fluid

The cut-off criteria are chipping of at least 0.5 mm of the edge line or a measured depth of 0.2 mm at either the flank- or the rake phase. Tool life is presented as the number of cut entrances in order to achieve these criteria.

TABLE 5

| Sample | Inner layer | Nanolayers in nano-multilayer | Comb crack resistance (No. cuts) | Edge line toughness (No. cuts) |
|---|---|---|---|---|
| 3 invention | $Ti_{0.40}Al_{0.60}N$, | $Ti_{0.40}Al_{0.60}N$/ $Ti_{0.80}Si_{0.20}N$/ $Ti_{0.25}Al_{0.75}N$ | 29 | 24 |
| 6 invention | nano-multi $Ti_{0.40}Al_{0.60}N$/ $Ti_{0.25}Al_{0.75}N$ | $Ti_{0.40}Al_{0.60}N$/ $Ti_{0.80}Si_{0.20}N$/ $Ti_{0.25}Al_{0.75}N$ | 37 | 50 |

The results in both the comb crack resistance test and edge line toughness (ELT) test are improved by the presence of an inner nano-multi $Ti_{0.40}Al_{0.60}N/Ti_{0.25}Al_{0.75}N$ layer instead of an inner $Ti_{0.40}Al_{0.60}N$ layer.

The invention claimed is:

1. A coated cutting tool comprising:

a substrate; and a coating disposed on the substrate, wherein the coating includes a nano-multilayer of alternating nanolayers of a first nanolayer type being $Ti_{1-x}Al_xN$, 0.35≤x<0.67, a second nanolayer being $Ti_{1-y}Si_yN$, 0.10≤y≤0.25, and a third nanolayer type being $Ti_{1-z}Al_2N$, 0.70≤z≤0.90, wherein a thickness of the nano-multilayer is from about 0.5 to about 10 μm, and wherein an average nanolayer thickness of each of the nanolayers $Ti_{1-x}Al_xN$, $Ti_{1-y}Si_yN$, and $Ti_{1-z}Al_zN$ in the nano-multilayer is from 1 to 30 nm, and wherein, throughout the nano-multilayer, within a sequence of 10 consecutive nanolayers in the nano-multilayer, all of the nanolayers $Ti_{1-x}Al_xN$, $Ti_{1-y}Si_yN$, and $Ti_{1-z}Al_zN$ are present.

2. The coated cutting tool according to claim 1, wherein there is a ratio in the nano-multilayer between the sum of thickness of all of each nanolayer $Ti_{1-x}Al_xN$:$Ti_{1-y}Si_yN$:$Ti_{1-z}Al_zN$, being a:b:c, wherein 0.5<a<3, 0.5<b<3, 0.5<c<3.

3. The coated cutting tool according to claim 1, wherein for the first nanolayer of $Ti_{1-x}Al_xN$ 0.40≤x≤0.67.

4. The coated cutting tool according to claim 1, wherein for the second nanolayer of $Ti_{1-y}Si_yN$ 0.13≤y≤0.23.

5. The coated cutting tool according to claim 1, wherein for the third nanolayer of $Ti_{1-z}Al_zN$ 0.70<z≤0.85.

6. The coated cutting tool according to claim 1, wherein the average nanolayer thickness in the nano-multilayer, of each of the nanolayers $Ti_{1-x}Al_xN$, $Ti_{1-y}Si_yN$, and $Ti_{1-z}Al_zN$ in the nano-multilayer, is from 1 to 20 nm.

7. The coated cutting tool according to claim 1, wherein a ratio of average nanolayer thickness in the nano-multilayer between any one of the nanolayers $Ti_{1-x}Al_xN$, $Ti_{1-y}Si_yN$, and $Ti_{1-z}Al_zN$ to any of a remaining two of the nanolayers $Ti_{1-x}Al$ N, $Ti_{1-y}Si_yN$, and $Ti_{1-z}Al_zN$ in the nano-multilayer is of from 0.1 to 10.

8. The coated cutting tool according to claim 1, wherein, throughout the nano-multilayer, within a sequence of 10 8 consecutive nanolayers in the nano-multilayer all of the nanolayers $Ti_{1-x}Al_xN$, $Ti_{1-y}Si_yN$, and $Ti_{1-z}Al_zN$ are present.

9. The coated cutting tool according to claim 1, wherein the thickness of the nano-multilayer is from about 1 to about 8 μm.

10. The coated cutting tool according to claim 1, wherein the coating includes an inner layer of TiN or (Ti,Al) N located below the nano-multilayer and closest to the substrate, the inner layer having a thickness of from about 0.1 to about 3 μm.

11. The coated cutting tool according to claim 10, wherein the inner layer is $Ti_{1-t}$AltN, $0.35 \leq t \leq 0.70$.

12. The coated cutting tool according to claim 10, wherein the inner layer is a (Ti,Al) N layer being a (Ti,Al) N nano-multilayer of alternating nanolayers of $Ti_{1-u}Al_uN$, $0.35 \leq u < 0.67$ and $Ti_{1-v}Al_vN$, $0.70 \leq v \leq 0.90$.

13. The coated cutting tool according to claim 1, wherein the substrate of the coated cutting tool is selected from the group consisting of cemented carbide, cermet, ceramic, cubic boron nitride and high speed steel.

14. The coated cutting tool according to claim 1, wherein the coated cutting tool is a cutting tool insert, a drill, or a solid end-mill, for metal machining.

* * * * *